(12) United States Patent
Darabi et al.

(10) Patent No.: US 8,019,309 B2
(45) Date of Patent: Sep. 13, 2011

(54) METHOD AND SYSTEM FOR A SECOND ORDER INPUT INTERCEPT POINT (IIP2) CALIBRATION SCHEME

(75) Inventors: Hooman Darabi, Irvine, CA (US); Brima Ibrahim, Aliso Viejo, CA (US); Hea Joung Kim, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 805 days.

(21) Appl. No.: 10/976,976

(22) Filed: Oct. 29, 2004

(65) Prior Publication Data

US 2006/0094386 A1 May 4, 2006

(51) Int. Cl.
*H04B 1/10* (2006.01)
(52) U.S. Cl. ............ 455/310; 455/63.1; 455/115.1; 455/115.4; 455/226.1
(58) Field of Classification Search ............ 455/310, 455/63.1, 115.1, 115.4, 226.1, 226.2, 296, 455/115.2, 226.3
See application file for complete search history.

(56) References Cited

U.S. PATENT DOCUMENTS

| | | | |
|---|---|---|---|
| 6,941,121 B2 * | 9/2005 | Chen | 455/232.1 |
| 7,228,109 B2 * | 6/2007 | Paulus et al. | 455/74 |
| 2003/0174783 A1 * | 9/2003 | Rahman et al. | 375/298 |
| 2005/0026583 A1 * | 2/2005 | Carpineto et al. | 455/232.1 |

* cited by examiner

*Primary Examiner* — Nay Maung
*Assistant Examiner* — Richard Chan
(74) *Attorney, Agent, or Firm* — McAndrews, Held & Malloy, Ltd.

(57) ABSTRACT

In RF transceivers, a method and system for a second order input intercept point (IIP2) calibration scheme are provided. Transceiver calibration schemes to compensate for DC offsets produced by interfering signals may be performed during production testing or field operation. During production testing, an external source may inject a blocker signal that produces DC offsets in the receiver portion of the transceiver. A transceiver switch may be set to receive mode in this scheme. During field operation, a power amplifier in the transmitter portion of the transceiver may inject the blocker signal. In this scheme, the switch may be set to transmit mode and the DC offsets are produced by the portion of the injected blocker signal that leaks through the switch. In both schemes, a DC offset sensor detects DC offsets in the I/Q signal paths and may determine compensation currents which may be applied by injection circuits.

37 Claims, 5 Drawing Sheets

METHOD AND SYSTEM FOR A SECOND ORDER INPUT INTERCEPT POINT (IIP2) CALIBRATION SCHEME

CROSS REFERENCE TO RELATED APPLICATIONS/INCORPORATION BY REFERENCE

This application is related to the following applications, each of which is incorporated herein by reference in its entirety for all purposes:
U.S. patent application Ser. No. 10/976,977 filed Oct. 29, 2004;
U.S. patent application Ser. No. 10/977,000 filed Oct. 29, 2004;
U.S. patent application Ser. No. 10/976,575 filed Oct. 29, 2004;
U.S. patent application Ser. No. 10/977,464 filed Oct. 29, 2004;
U.S. patent application Ser. No. 10/977,798 filed Oct. 29, 2004:
U.S. patent application Ser. No. 10/977,005 filed Oct. 29, 2004;
U.S. patent application Ser. No. 10/977,771 filed Oct. 29, 2004;
U.S. patent application Ser. No. 10/977,868 filed Oct. 29, 2004;
U.S. patent application Ser. No. 10/976,666 filed Oct. 29, 2004;
U.S. patent application Ser. No. 10/977,631 filed Oct. 29, 2004;
U.S. patent application Ser. No. 10/976,639 filed Oct. 29, 2004;
U.S. patent application Ser. No. 10/977,210 filed Oct. 29, 2004;
U.S. patent application Ser. No. 10/977,872 filed Oct. 29, 2004;
U.S. patent application Ser. No. 10/977,869 filed Oct. 29, 2004;
U.S. patent application Ser. No. 10/977,874 filed Oct. 29, 2004; and
U.S. patent application Ser. No. 10/976,996 filed Oct. 29, 2004.

FEDERALLY SPONSORED RESEARCH OR DEVELOPMENT

Not applicable.

MICROFICHE/COPYRIGHT REFERENCE

Not applicable.

FIELD OF THE INVENTION

Certain embodiments of the invention relate to the processing of radio signals in a radio frequency (RF) transceiver. More specifically, certain embodiments of the invention relate to a method and system for a second order input intercept point (IIP2) calibration scheme.

BACKGROUND OF THE INVENTION

In radio frequency (RF) applications, an RF receiver or a receiver portion of an RF transceiver may be required to tolerate the presence of large interfering signals lying within the passband that corresponds to a communication channel of interest. These interfering signals may have originated from users in adjacent channels and/or from transmission sources which may be relatively far removed in frequency from the channel of interest but whose large transmission power may still cause significant interference problems. These interfering signals may be referred to as blockers and their relative frequency and/or detected power to that of the desired signal may vary based on transmission scheme and/or operational conditions. The effect of interfering signals in the channel of interest may result in, for example, bit error rate (BER) degradation in digital RF systems and audible and/or visible signal-to-noise ratio (SNR) degradation in analog RF systems.

However, the ability to provide an interference-tolerant design may be difficult to accomplish as second-order distortion effects are increasingly becoming a limitation in circuitry utilized by the wireless receivers. For example, mixers and/or other circuitry which may be utilized to downconvert a channel of interest to a zero intermediate frequency (IF) or to a low IF may generate, as a result of second-order nonlinearities, spectral components from blocker signals which may be at or near DC. The effect of these spectral components may be to introduce a DC offset to the desired signals at the zero IF which may result in signal saturation or, as mentioned above, a noticeable degradation to the system's noise performance.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

Certain embodiments of the invention may be found in a method and system for a second order input intercept point (IIP2) calibration scheme. Aspects of the method may comprise receiving a blocker signal in a radio frequency (RF) transceiver front end. In this case, a receive mode may be selected in the RF transceiver front end. The blocker signal may be at least 6 MHz from a desired signal frequency in a channel of interest and may be generated externally to the RF transceiver front end. A first DC offset and a second DC offset may be detected in a receiver portion of the RF transceiver front end. The first DC offset may be detected in an "I" (in-phase) signal component path in the receiver portion of the RF transceiver front end. The second DC offset may be detected in a "Q" (quadrature) signal component path in the receiver portion of the RF transceiver front end. The first DC offset and the second DC offset may be produced by the received blocker signal.

The method may comprise generating a first DC offset current to compensate for the detected first DC offset and a second DC offset current to compensate for the detected second DC offset. The method may also comprise storing a parameter that represents the generated first DC offset current and a parameter that represents the generated second DC offset current.

In another embodiment of the invention, the method may comprise transferring a blocker signal from a transmitter portion of an RF transceiver front end to a receiver portion of the RF transceiver front end. In this case, a transmit mode may be selected in the RF transceiver front end. The blocker signal may be at least 6 MHz from a desired signal frequency in a channel of interest and may be transferred to the receiver portion of the RF transceiver front end via a transceiver switch. The transferred blocker signal may be amplified in the receiver portion of the RF transceiver front end.

A first DC offset and a second DC offset may be detected in the receiver portion of the RF transceiver. The first DC offset may be detected in an "I" signal component path in the receiver portion of the RF transceiver front end. The second DC offset may be detected in a "Q" signal component path in the receiver portion of the RF transceiver front end. The first DC offset and the second DC offset may be produced by the transferred blocker signal.

The method may also comprise generating a first DC offset current to compensate for the detected first DC offset and a second DC offset current to compensate for the detected second DC offset. The method may also comprise storing a parameter that represents the generated first DC offset current and a parameter that represents said generated second DC offset current.

In another aspect of the method, the first DC offset and the second DC offset may be detected at a plurality of instances during the operation of the RF transceiver front end. These instances may be determined based on a specified time interval or on a specified packet interval. The first DC offset current and the second DC offset current may be generated for each of these instances during the operation of the RF transceiver front end. Moreover, a parameter that represents the generated first DC offset current and a parameter that represents the generated second DC offset current may be stored for each of these instances.

Aspects of the system may comprise a DC offset sensor that detects a first DC offset and a second DC offset in a receiver portion of a radio frequency (RF) transceiver front end. The system may also comprise at least one processor that selects a receive mode in the RF transceiver front end. The first DC offset and the second DC offset may be produced by a blocker signal transferred to the RF transceiver front end. The blocker signal may be generated externally to the RF transceiver front end and may be at least 6 MHz from a desired signal frequency in a channel of interest. The DC offset sensor may detect the first DC offset in an "I" (in-phase) signal component path in the receiver portion of the RF transceiver front end. The DC offset sensor may detect the second DC offset in a "Q" (quadrature) signal component path in the receiver portion of the RF transceiver front end.

The system may also comprise first circuit that may be adapted to generate a first DC offset current to compensate for the detected first DC offset and a second circuit that may be adapted to generate a second DC offset current to compensate for the detected second DC offset. The DC offset sensor may store a parameter that represents the generated first DC offset current and a parameter that represents the generated second DC offset current. The DC offset sensor may also transfer the parameter that represents the generated first DC offset current and the parameter that represents the generated second DC offset current to be stored in a system memory.

In another embodiment of the invention, the system may comprise a DC offset sensor that detects a first DC offset and a second DC offset in a receiver portion of a radio frequency (RF) transceiver front end. The system may also comprise at least one processor that selects a transmit mode in the RF transceiver front end. The first DC offset and the second DC offset may be produced by a blocker signal transferred from a transmitter portion of the RF transceiver front end. A power amplifier in the transmitter portion of the RF transceiver front end may amplify the blocker signal. A low noise amplifier in the receiver portion of the RF transceiver front end may amplify the transferred blocker signal. The blocker signal may be at least 6 MHz from a desired signal frequency in a channel of interest. The DC offset sensor may detect the first DC offset in an "I" (in-phase) signal component path in the receiver portion of the RF transceiver front end. The DC offset sensor may detect the second DC offset in a "Q" (quadrature) signal component path in the receiver portion of the RF transceiver front end.

The system may also comprise a first circuit that may be adapted to generate a first DC offset current to compensate for the detected first DC offset and a second circuit that may be adapted to generate a second DC offset current to compensate for the detected second DC offset. The DC offset sensor may store a parameter that represents the generated first DC offset current and a parameter that represents the generated second DC offset current. The DC offset sensor may also transfer the parameter that represents the generated first DC offset current and the parameter that represents the generated second DC offset current to be stored in a system memory.

In another aspect of the system, the DC offset sensor may detect the first DC offset and the second DC offset in the receiver portion of the RF transceiver front end at a plurality of instances during the operation of the RF transceiver front end. The system may comprise at least one processor that determines these instances based on a specified time interval or on a specified packet interval. The first circuit may be adapted to generate the first DC offset current and the second circuit may be adapted to generate the second DC offset current for each of these instances.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for a second order input intercept point (IIP2) calibration scheme. An IIP2 production testing calibration scheme and an IIP2 field operation calibration scheme may be provided for an RF transceiver to compensate DC offsets produced by blocker signals as a result of second order nonlinearities exhibited in a receiver portion of the RF transceiver front end. During the IIP2 production testing calibration scheme, blocker signals may be injected to determine the DC offset compensations to be applied by injection circuits in the RF transceiver front end. The IIP2 field operation calibration scheme may utilize the non-ideal isolation of a transceiver switch to inject blocker signals from a transmitter portion to the receiver portion of the RF transceiver front end to determine DC offset compensations to be applied by injection circuits. The latter scheme may allow for IIP2 calibration updates as operational conditions in the RF transceiver vary.

Figure 1:
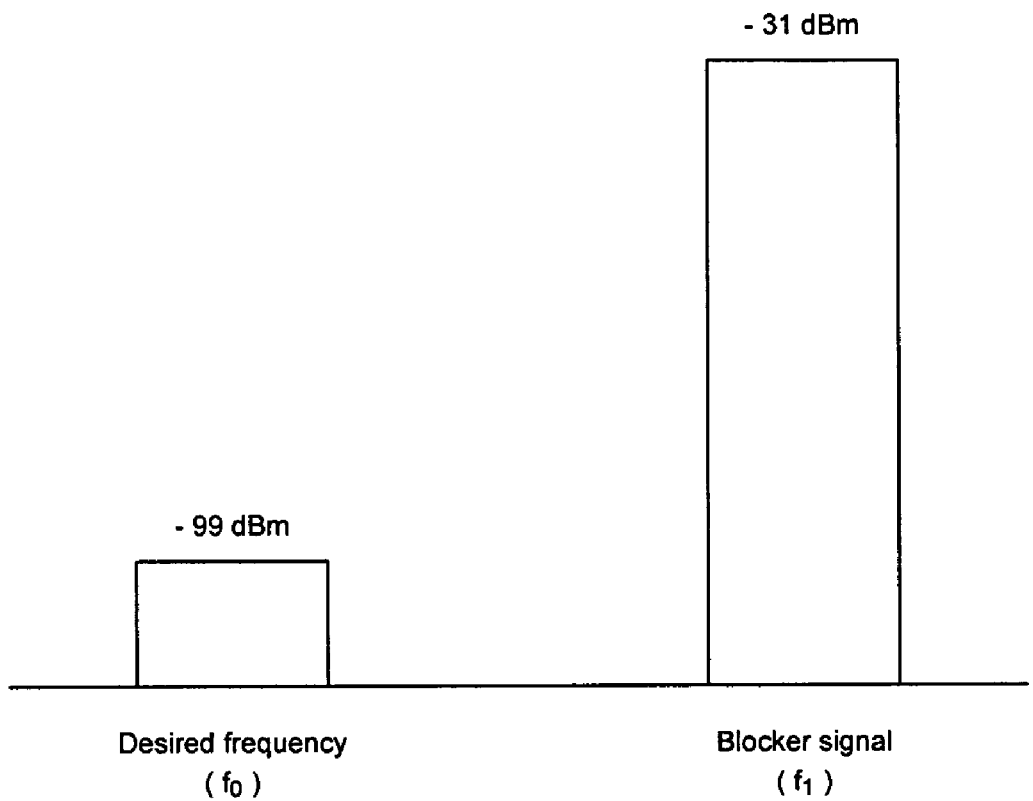
FIG. 1 illustrates an exemplary desired signal and an exemplary blocker signal within the passband of the channel of interest, in accordance with an embodiment of the invention.

FIG. 1 illustrates an exemplary desired signal and an exemplary blocker signal within the passband of the channel of interest, in accordance with an embodiment of the invention. Referring to FIG. 1, a desired signal at frequency $f_0$ and a blocker signal at frequency $f_1$ are shown. In the Global System for Mobile Communications (GSM) standard, for example, the frequency difference between the desired signal and the blocker signal may be expressed by $|f_1-f_0|>6$ MHz. The GSM standard also provides that, in some instances, the desired signal strength may be as low as −99 dBm while the blocker signal strength may be as high as −31 dBm. Since the blocker signal may be much larger than the desired signal, second order nonlinearities in an RF receiver may result in unwanted DC offset that may saturate the receive path and may also degrade the signal-to-noise ratio (SNR).

The receiver second order nonlinearities may be represented by the value of the second order input intercept point (IIP2). In GSM-based applications, for example, the specified IIP2 may be +34 dBm. The specified IIP2 value may vary significantly according to application and/or system requirements. This value of IIP2 may be difficult to achieve given the specified ranges for the desired signal strength and blocker signal strength. The effects of second order nonlinearities in other communication standards may pose similar difficulties. For example, IIP2 value for the Personal Communication Service (PCS) standard may be +34 dBm, for PCS at an intermediate frequency (IF) of 108 KHz the specified IIP2 value may be +28 dBm, and for PCS at an IF of 108 KHz and 8 dB steps the specified IIP2 value may also be +28 dBm.

Figure 2:
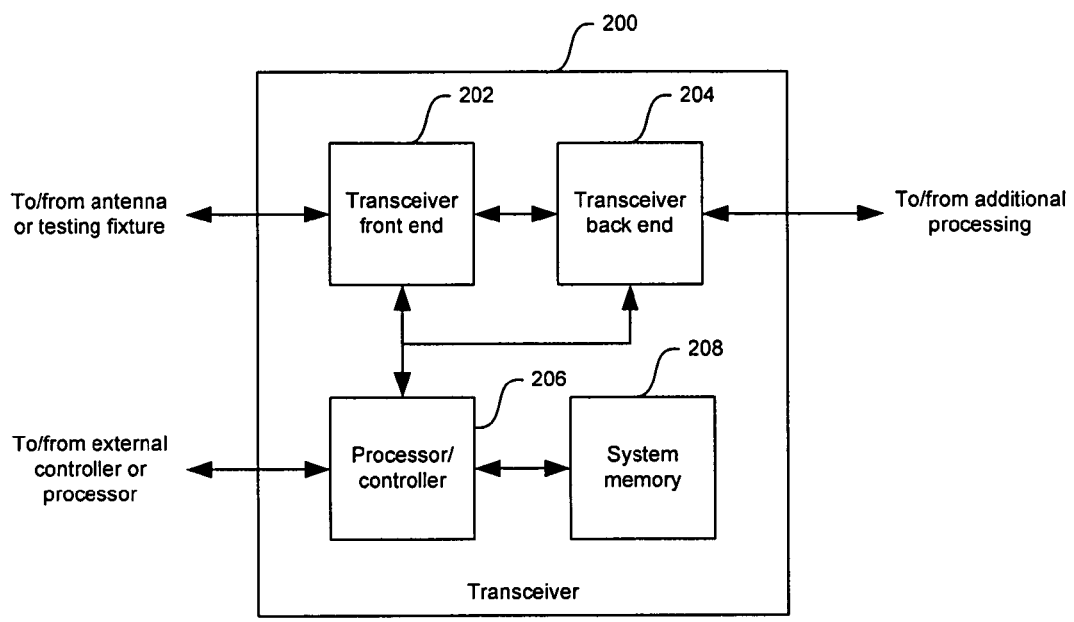
FIG. 2 is a block diagram of an exemplary RF transceiver system, in accordance with an embodiment of the invention.

FIG. 2 is a block diagram of an exemplary RF transceiver system, in accordance with an embodiment of the invention. Referring to FIG. 2, the RF transceiver system 200 may comprise a transceiver front end 202, a transceiver back end 204, a controller/processor 206, and a system memory 208. The transceiver front end 202 may comprise suitable logic, circuitry, and/or code that may be adapted to receive and/or transmit an RF signal. The transceiver front end 202 may comprise a receiver portion and a transmitter portion. Both the transmitter portion and the receiver portion may be coupled to an external antenna for signal broadcasting and signal reception respectively. The transceiver front end 202 may modulate a signal for transmission and may also demodulate a received signal before further processing of the received signal is to take place. Moreover, the transceiver front end 202 may provide other functions, for example, digital-to-analog conversion, analog-to-digital conversion, frequency downsampling, frequency upsampling, and/or filtering.

The transceiver back end 204 may comprise suitable logic, circuitry, and/or code that may be adapted to digitally process received signals from the transceiver front end 204 and/or to process signals received from at least one processing block external to the RF transceiver system 200. The controller/processor 206 may comprise suitable logic, circuitry, and/or code that may be adapted to control the operations of the transceiver front end 202 and/or the transceiver back end 204. For example, the controller/processor 206 may be utilized to update and/or modify programmable parameters and/or values in a plurality of components, devices, and/or processing elements in the transceiver front end 202 and/or in the transceiver back end 204. Control and/or data information may be transferred from at least one controller and/or processor external to the RF transceiver system 200 to the controller/processor 206 during the operation of the RF transceiver system 200. Moreover, the controller/processor 206 may also transfer control and/or data information to at least one controller and/or processor external to the RF transceiver system 200.

The controller/processor 206 may utilize the received control and/or data information to determine the mode of operation of the transceiver front end 202. For example, the controller/processor 206 may select between an IIP2 production testing calibration scheme and an IIP2 field operation calibration scheme and may configure and operate the transceiver front end 202 accordingly. Moreover, IIP2 compensation currents determined during either IIP2 calibration scheme may be stored in the system memory 202 via the controller/processor 206. Stored IIP2 compensation currents may be transferred to the transceiver front end 202 from the system memory 208 via the controller/processor 206. The system memory 208 may comprise suitable logic, circuitry, and/or code that may be adapted to store a plurality of control and/or data information, including IIP2 compensation currents determined during either IIP2 calibration scheme.

Figure 3:
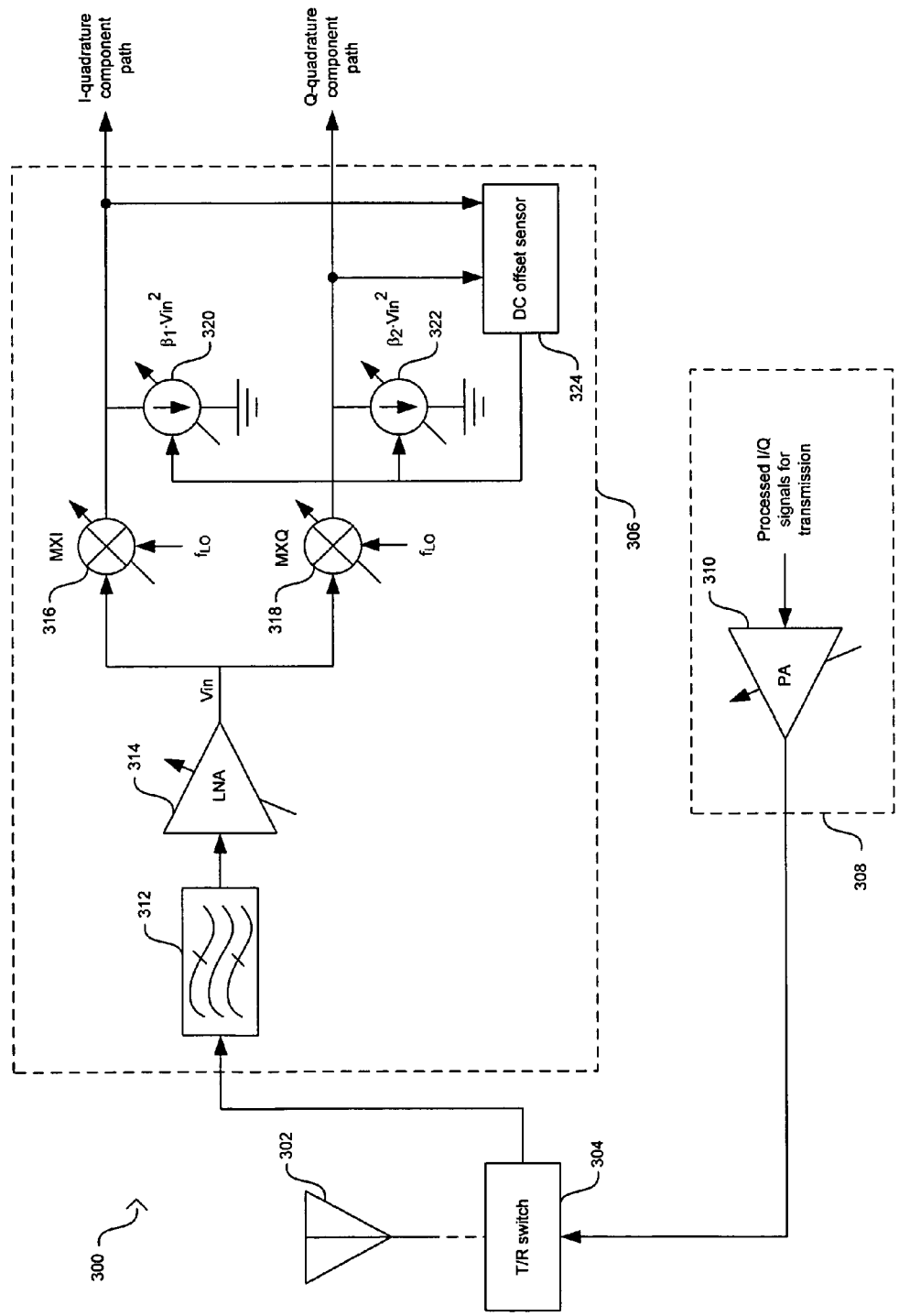
FIG. 3 is a block diagram that illustrates a receiver portion and a transmitter portion of an exemplary transceiver front end, in accordance with an embodiment of the invention.

FIG. 3 is a block diagram that illustrates a receiver portion and a transmitter portion of an exemplary transceiver front end, in accordance with an embodiment of the invention. Referring to FIG. 3, the transceiver front end 300 may comprise a transmit/receive (T/R) switch 304, a receiver portion 306, and a transmitter portion 308. The T/R switch 304 may comprise suitable logic, circuitry, and/or code that may be adapted to select between a transmit mode, in which signals may be transferred from the transceiver front end 300, and a receive mode, in which signals may be transferred from either an external antenna or a testing fixture, for example, to the transceiver front end 300. Whether the T/R switch 304 selects the transmit mode or the receive mode may be signaled by, for example, the controller/processor 206 in FIG. 2.

Regarding the receive mode of operation, FIG. 3 shows an antenna 302 coupled to the T/R switch 304 with a dashed line to indicate that the antenna 302 may be one of a plurality of elements, components, and/or devices that may be coupled to the T/R switch 304. For example, during IIP2 field operation calibration, the T/R switch 304 may be coupled to the antenna 302, while during IIP2 production testing calibration, the T/R switch 304 may be coupled to, for example, an external test fixture. Isolation between the receiver portion 306, the transmitter portion 308, and the external connection of the T/R switch 304 may not be perfect and, as a result, a certain amount of leakage may take place. For example, during the transmit mode of operation, a portion of the transmitted signal from the transmitter portion 308 may be leaked to the receiver portion 306.

The transmitter portion 308 may comprise a power amplifier (PA) 310 that amplifies an "I" (in-phase) signal component and/or a "Q" (quadrature) signal component before transferring either signal to the T/R switch 304 for transmission. Certain aspects of the PA 310 may be programmed by, for example, the controller/processor 206 in FIG. 2. One of these aspects may be the gain applied by the PA 310 to the "I" signal component and/or the "Q" signal component before transferring either signal to the T/R switch 304 for transmission. The output signal frequency from the PA 310 during IIP2 calibration may be given as $f_{LO}$-26 MHz, where $f_{LO}$ is a local oscillator frequency ($f_{LO}$) as utilized in the receiver portion 306. While FIG. 3 only shows the PA 310, the transmitter portion 308 may not be so limited and may also comprise additional logic, circuitry, and/or code that may be adapted to process the I/Q signal components before amplification by the PA 310. The transmitter portion 308 may be utilized to provide a blocker signal to the receiver portion 306 during operation of the transceiver front end 300. In this regard, the PA 310 may be utilized to control the gain of the blocker signal being transferred from the transmitter portion 308 to the receiver portion 306.

The receiver portion 306 may comprise a bandpass filter 312, a low noise amplifier (LNA) 314, a "I" component mixer (MXI) 316, a "Q" component mixer (MXQ) 318, a first injection circuit 320, a second injection circuit 322, and a DC offset sensor 324. The receiver portion 306 may not be limited to the elements, components, and/or devices shown in FIG. 3 and may also comprise additional logic, circuitry, and/or code that may be adapted to further process the I/Q signal components. The bandpass filter 312 may comprise suitable logic, circuitry, and/or code that may be adapted to select signals in the bandpass of the channel of interest. The bandpass filter 312 may have a frequency band of 925 to 960 MHz, for example. The LNA 314 may comprise suitable logic, circuitry, and/or code that may be adapted amplify the output of the bandpass filter 312. Certain aspects of the LNA 314 may be programmed by, for example, the controller/processor 206 in FIG. 2. One of these aspects may be the gain applied by the LNA 314 to the output of the bandpass filter 312. In some instances, change the gain in the LNA 314 to a mid-gain level may improve upon the receiver portion 306 IIP2 performance.

The MXI 316 may comprise suitable logic, circuitry, and/or code that may be adapted to mix the output of the LNA 314, Vin, with the local oscillator frequency ($f_{LO}$) to produce a zero intermediate frequency (IF) "I" signal component. The "I" signal component may be a differential signal, for example. Certain aspects of the MXI 316 may be programmed by, for example, the controller/processor 206 in FIG. 2. The MXQ 318 may comprise suitable logic, circuitry, and/or code that may be adapted to mix the output of the LNA 314, Vin, with a local oscillator frequency ($f_{LO}$) to produce a zero IF "Q" signal component. The "Q" signal component may be a differential signal, for example. Certain aspects of the MXQ 318 may be programmed by, for example, the controller/processor 206 in FIG. 2. The IIP2 performance of the receiver portion 306 may be limited in part by the second order nonlinear characteristics of the MXI 316 and/or the MXQ 318. Moreover, a variable IF, for example, 100 KHz, 104 KHz, 108 KHz, or 112 KHz, may be utilized to trade between I/Q quadrature components matching and improving the receiver portion 306 IIP2 performance.

The first injection circuit 320 may comprise suitable logic, circuitry, and/or code that may be adapted to apply a first DC offset current that compensates for DC offset values produced on the "I" signal component by second order distortion in the receiver portion 306. The first DC offset current may be a current which may be expressed as $\beta_1 \cdot Vin^2$, where $\beta_1$ is a first proportionality parameter and Vin is the output of the LNA 314. The first proportionality parameter, $\beta_1$, may correspond to a complementary metal oxide semiconductor (CMOS) transconductance parameter representative of a portion of the transistors in the first injection circuit 320 that may be utilized to generate the first DC offset current. The applied current is proportional to $Vin^2$ to compensate for the second order nonlinearities of the receiver portion 306. The current applied by the first injection circuit 320 may be a differential current, for example. Certain aspects of the first injection circuit 320 may be programmable and may be programmed by, for example, the DC offset sensor 324. Some of these aspects may be the amplitude and polarity of the first DC offset current.

The second injection circuit 322 may comprise suitable logic, circuitry, and/or code that may be adapted to apply a second DC offset current that compensates for DC offset values produced on the "Q" signal component by second order distortion in the receiver portion 306. The second DC offset current may be a current which may be expressed as $\beta_2 \cdot Vin^2$, where $\beta_2$ is a second proportionality parameter and Vin is the output voltage of the LNA 314. The second proportionality parameter, $\beta_2$, may correspond to a CMOS transistor transconductance parameter representative of a portion of the transistors in the second injection circuit 322 that may be utilized to generate the first DC offset current. The applied current is proportional to $Vin^2$ to compensate for the second order nonlinearities of the receiver portion 306. The current applied by the second injection circuit 322 may be a differential current, for example. Certain aspects of the second injection circuit 322 may be programmable and may be programmed by, for example, the DC offset sensor 324. Some of these aspects may be the amplitude and polarity of the second DC offset current.

The DC offset sensor 324 may comprise suitable logic, circuitry, and/of code that may be adapted to sense or detect DC offset levels in the "I" signal component path and/or the "Q" signal component path in the receiver portion 306. The DC offset sensor 324 may generate a parameter that represents the first DC offset current and/or a parameter that represents the second DC offset current based on the sensing or detection of the "I" signal component path and/or the "Q" signal component path respectively. The DC offset current parameters may comprise information regarding the manner in which the injection circuits may generate the DC offset currents and/or information regarding the value of Vin. The DC offset sensor 324 may then transfer the first DC offset current parameter to the first injection circuit 320 and the second DC offset current parameter to the second injection circuit 322. Sensing by the DC offset sensor 324 may be performed at instances which may be determined based on a schedule or as instructed by, for example, the controller/processor 206 in FIG. 2. In some instances, the DC offset sensor 324 may comprise a local memory that may be adapted to store the DC offset current parameters after calibration. The DC offset sensor 324 may also transfer the DC offset current parameters to the system memory 208 in FIG. 2 for digital storage via the controller/processor 206, for example. The DC offset sensor 324 may also be utilized to determine variations in circuit performance based on temperature change, operational changes such as voltage variations, and variations in the process utilized during integrated circuit (IC) manufacturing.

A signal generator adapted to generate a blocker signal may also be utilized to transfer a blocker signal to the receiver portion 306 of the transceiver front end 300 in FIG. 3. For example, the signal generator may be part of the transceiver 200 in FIG. 2 or may be external to the transceiver 200. When internal to the transceiver 200, the signal generator may transfer the blocker signal to the receiver portion 306 via the PA 310, for example. The signal generator may be utilized to generate a blocker signal either during production testing or during field operation.

Figure 4A:
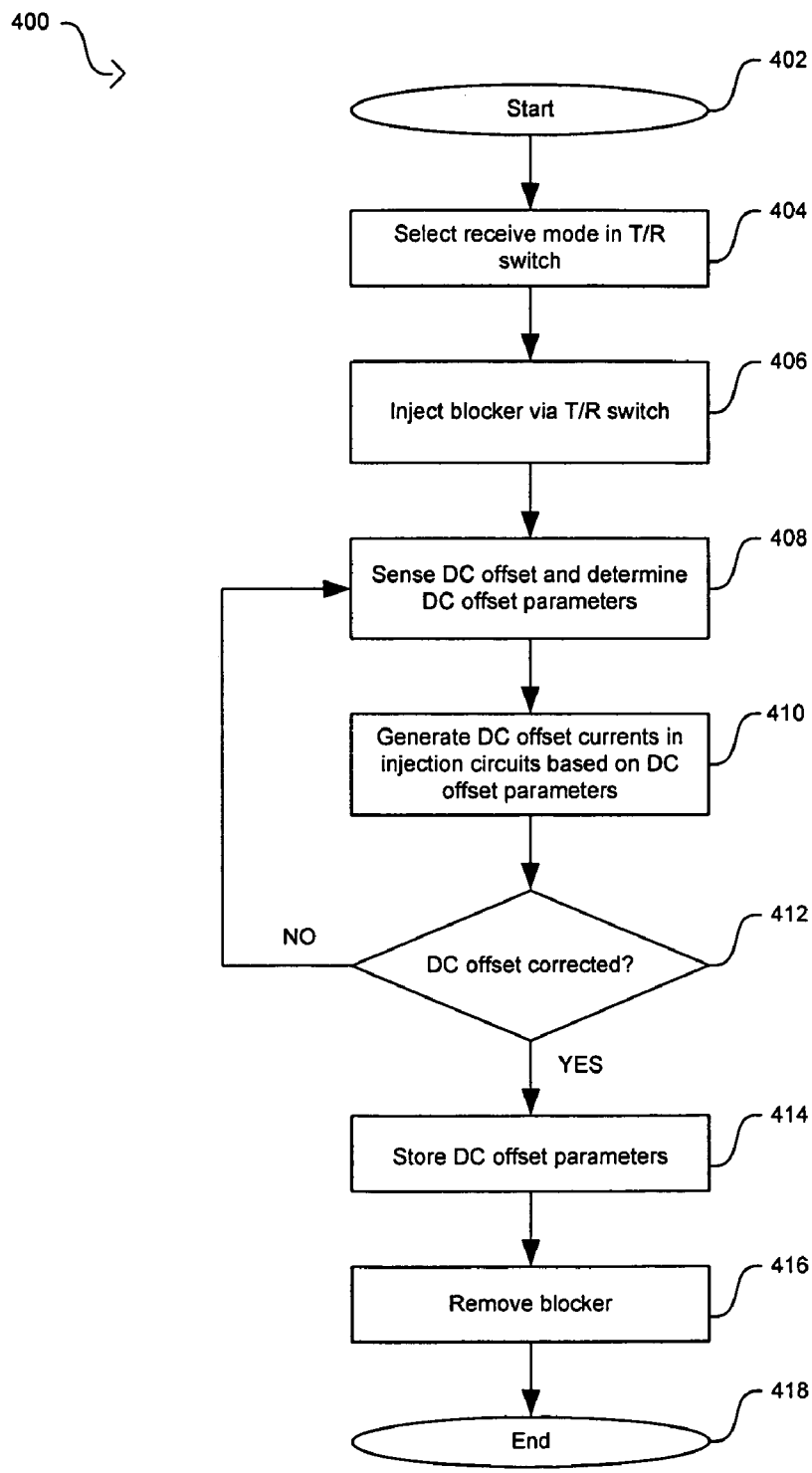
FIG. 4A is a flow diagram that illustrates exemplary steps in an IIP2 production testing calibration scheme, in accordance with an embodiment of the invention.

FIG. 4A is a flow diagram that illustrates exemplary steps in an IIP2 production testing calibration scheme, in accordance with an embodiment of the invention. Referring to FIG. 4A, in step 404, the T/R switch 304 in FIG. 3 may be set to a receive mode during calibration. In step 406, a blocker signal may be injected into the transceiver front end 300 via the T/R switch 304. A test fixture may be utilized to generate the blocker signal or may transfer a blocker signal generated by a different testing device. The blocker signal may be generated in accordance with the specifications provided by the GSM standard, for example. For production testing calibration purposes, the blocker signal frequency may be 26 MHz, for example. The frequency of the blocker signal may be chosen in accordance with the characteristics and performance of the device, element, and/or component generating the blocker signal.

In step 408, the DC offset sensor 324 may sense or detect the DC offsets produced by the second order nonlinearities in the receiver portion 306 in FIG. 3. The DC offset sensor 324 may then generate the first DC offset current parameter and the second DC offset current parameter that may be utilized to generate the appropriate DC offsets currents to compensate the DC offsets produced in the "I" and "Q" signal components. In step 410, the DC offset sensor 324 may transfer or program the values for the first DC offset current parameter and the second DC offset current parameter to the first injection circuit 320 and the second injection circuit 322 respectively. The first injection circuit 320 and the second injection circuit 322 may provide DC offset compensation by generating the first DC offset current and the second DC offset current respectively from the DC offset parameters provided by the DC offset sensor 324.

In step 412, the DC offset sensor 324 may be utilized to determine whether the first DC offset current and the second DC offset current have corrected or compensated the first DC offset and the second DC offset respectively. In this regard, the DC offset sensor 324 may utilize a threshold value to determine a range within which the first DC offset and the second DC offset may have been corrected by the first DC offset current and the second DC offset current respectively. When the DC offsets have not been corrected by the DC offset currents, the flow diagram 400 may return to step 408 and a next first DC offset current parameter and a next second DC offset current parameter may be generated. When the DC offsets have been corrected by the DC offset currents, the flow diagram 400 may proceed to step 414.

In step 414, the DC offset sensor 324 may store the values of the first and second DC offset current parameters that compensate or correct the DC offsets in a local memory and/or may transfer them to a system memory for use after production testing calibration is complete. In step 416, the blocker signal may be removed from the transceiver front end 300 to complete the calibration procedure. After step 416, the flow diagram 400 may proceed to end step 418 where the current transceiver front end 300 has been calibrated and production testing of a next transceiver front end may proceed.

Figure 4B:
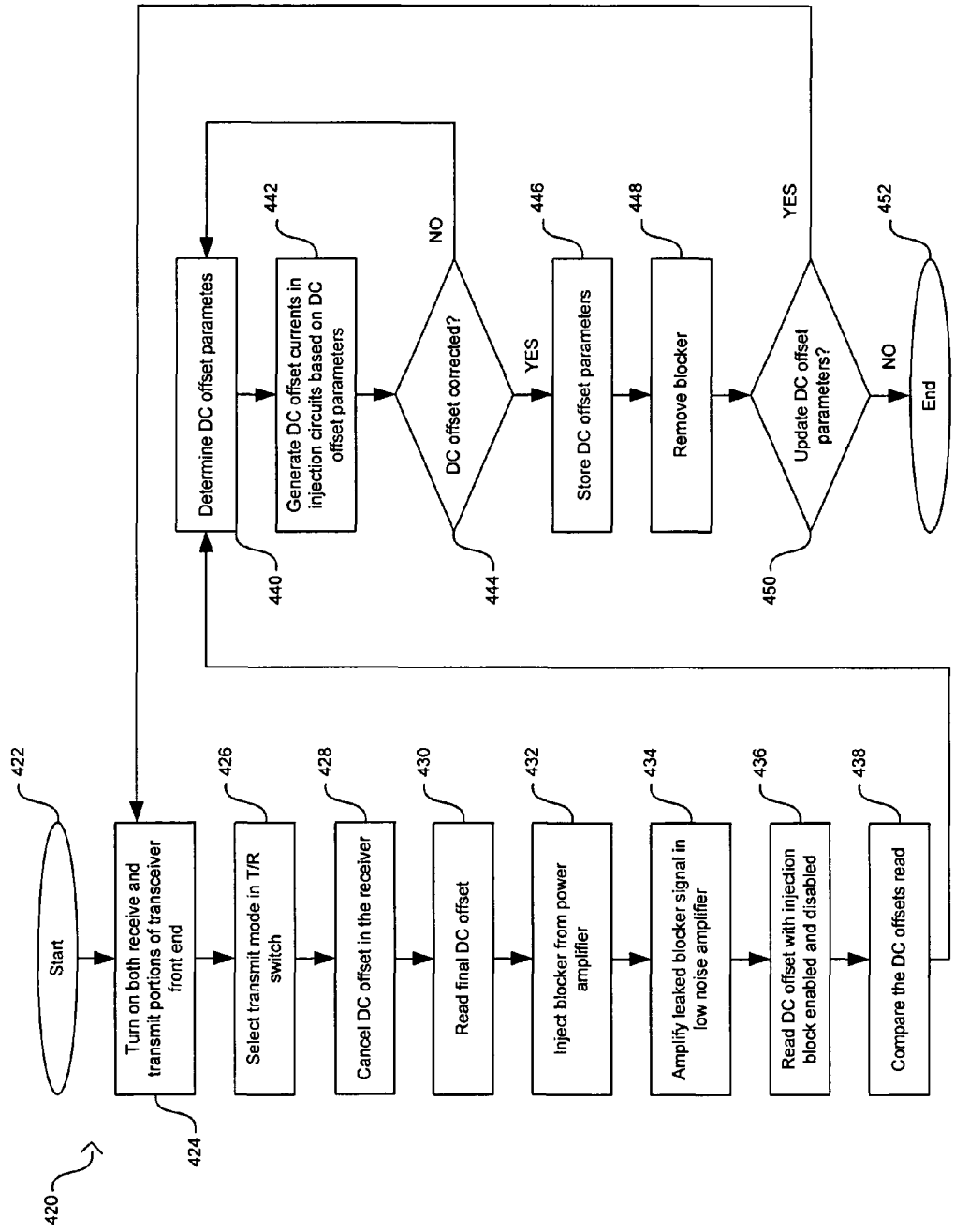
FIG. 4B is a flow diagram that illustrates exemplary steps in an IIP2 field operation calibration scheme, in accordance with an embodiment of the invention.

FIG. 4B is a flow diagram that illustrates exemplary steps in an IIP2 field operation calibration scheme, in accordance with an embodiment of the invention. Referring to FIG. 4B, in step 424, the transmitter portion 308 and the receiver portion 310 in FIG. 3 may both be turned ON during field operation calibration. This may be required when the transceiver front end 300 has the ability to turn ON or OFF either portion to conserve power, for example. In this regard, step 424 may be performed to guarantee that both the transmitter portion 308 and the receiver portion 306 are available during calibration. In step 426, the transmit mode of the T/R switch 426 may be selected. In this case, the transceiver front end 300 may be in field operation and the antenna 302 in FIG. 3 may be coupled to the T/R switch 304, for example.

In step 428, the DC offset cancellation may be performed for a given code value that may be applied to the injection circuits 320 and 322 in FIG. 3 while the transmitter portion 308 is ramping up. In step 430, a final DC offset may be read before the transmitter portion 308 is completely ramped up. In step 432, a blocker signal may be generated by the PA 310 and may be transferred to the T/R switch 304 for transmission after the transmitter portion 308 has ramped up to the appropriate operating conditions. The PA 310 may generate the blocker signal in accordance with the specifications provided by the GSM standard, for example. For field operation calibration purposes, for example, the blocker signal frequency may be 26 MHz or it may be a frequency in accordance with the characteristics and performance of the PA 310. Since the isolation between the transmitter port and the receiver port of the T/R switch 304 is not perfect, as a result, a portion of the signal generated by the PA 310 may leak into the receiver port. The T/R switch may have 30 dB to 40 dB leakage between the transmitter port and the receiver port, for example.

In step 434, the leaked signal may be amplified by the LNA 314 after passing through the bandpass filter 312. For example, when the PA 310 peak signal is close to 30 dBm, the leaked signal may be −10 dBm when the attenuation in the T/R switch 304 is 40 dB. In this case, the LNA 314 gain may be adjusted or programmed accordingly to provide the proper blocker signal strength to the MXI 316 and MXQ 318 mixers.

In step 436, the DC offset produced by the second order nonlinearities in the receiver portion 306 in FIG. 3 may be sensed or detected by the DC offset sensor 324. This may be done with the injection circuits 320 and 322 enabled and may also be done with the injection circuits 320 and 322 disabled. In step 438, the final DC offset value read in step 430 and the values read in step 436 may be compared to determine the right amount of injection. In step 440, the DC offset sensor 324 may then generate the first DC offset current parameter and the second DC offset current parameter that may be utilized to generate the appropriate DC offsets currents, that is, the appropriate injection as determined in step 438, to compensate the DC offsets produced in the quadrature components signals. In step 442, the DC offset sensor 324 may transfer or program the values for the first DC offset current parameter and the second DC offset current parameter to the first injection circuit 320 and the second injection circuit 322 respectively. The first injection circuit 320 and the second injection circuit 322 may provide DC offset compensation by generating the first DC offset current and the second DC offset current respectively from the DC offset parameters transferred.

In step 444, the DC offset sensor 324 may be utilized to determine whether the first DC offset current and the second DC offset current have corrected or compensated the first DC offset and the second DC offset respectively. In this regard, the DC offset sensor 324 may utilize a threshold value to determine a range within which the first DC offset and the second DC offset may have been corrected by the first DC offset current and the second DC offset current respectively. When the DC offsets have not been corrected by the DC offset currents, the flow diagram 420 may return, for example, to step 440 and a next first DC offset current parameter and a next second DC offset current parameter may be generated. When the DC offsets have been corrected by the DC offset currents, the flow diagram 420 may proceed to step 446.

In step 446, the DC offset sensor 324 may store the values of the first and second DC offset currents parameters that compensate or correct the DC offsets in a local memory and/or in a system memory for use after field operation calibration is complete. In step 448, the PA 310 may remove the blocker signal to complete the calibration procedure and the requirement that both the receiver portion 306 and the transmitter portion 308 be both on is no longer necessary for IIP2 calibration. In step 450, the transceiver front end 300 may determine whether the DC offset current parameters may need to be updated or modified. An update or modification may be signaled by, for example, the controller/processor 206 to the transceiver front end 300 based on a specified time interval, or packet interval, or at the request of an external processor or controller. When an update to the DC offset current parameters is required, the flow diagram 420 may return to step 424 and a new calibration process may begin. When no update is required, the flow diagram may proceed to end step 452.

The IIP2 production testing calibration scheme and the IIP2 field operation calibration scheme described above may be utilized to compensate for DC offsets produced by blocker signals as a result of second order nonlinearities exhibited in a receiver portion of an RF transceiver front end. The latter scheme may allow for IIP2 calibration updates without any major area or power increase as operational conditions in the RF transceiver vary. In some instances, a better than 10 dB improvement may be achieved in IIP2 performance by utilizing the calibration schemes described above.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
receiving a calibration blocker signal in a radio frequency (RF) front end portion of a receiver via a component that is shared by a transmitter and said receiver, wherein:
said calibration blocker signal is coupled into said RF front end portion of said receiver from an RF front end portion of said transmitter; and
said RF front end portion of said receiver, said RF front end portion of said transmitter, and said shared component are integrated within a single device;
detecting a first DC offset and a second DC offset in said RF front end portion of said receiver, wherein said first DC offset and said second DC offset are produced by said received calibration blocker signal; and
generating, in said RF front end portion of said receiver, a first DC offset current to compensate for said detected first DC offset and a second DC offset current to compensate for said detected second DC offset.

2. The method according to claim 1, wherein said receiver is part of a wireless transceiver.

3. The method according to claim 1, comprising storing a parameter that represents said generated first DC offset current and a parameter that represents said generated second DC offset current.

4. The method according to claim 1, wherein said calibration blocker signal is at least 6 MHz from a desired signal frequency in a channel of interest.

5. The method according to claim 1, comprising detecting said first DC offset in an "I" (in-phase) signal component path in said RF front end portion of said receiver.

6. The method according to claim 1, comprising detecting said second DC offset in a "Q" (quadrature) signal component path in said RF front end portion of said receiver.

7. A method for signal processing, the method comprising:
receiving by a radio frequency (RF) portion of a receiver, a calibration blocker signal from an RF front end portion of a transmitter, wherein:
said calibration blocker signal is coupled into said RF front end portion of said received by said RF front end portion of said transmitter; and
said RF front end portion of said receiver and said RF front end portion of said transmitter are integrated within a single device;
detecting a first DC offset and a second DC offset in said RF front end portion of said receiver, wherein said first DC offset and said second DC offset are produced by said received calibration blocker signal; and
generating, in said RF front end portion of said receiver, a first DC offset current to compensate for said detected first DC offset and a second DC offset current to compensate for said detected second DC offset.

8. The method according to claim 7, wherein said receiver is part of a wireless transceiver.

9. The method according to claim 7, wherein said calibration blocker signal is received by said RF front end portion of said receiver via a transceiver switch.

10. The method according to claim 7, comprising storing a parameter that represents said generated first DC offset current and a parameter that represents said generated second DC offset current.

11. The method according to claim 7, comprising detecting said first DC offset in an "I" (in-phase) signal component path in said RF front end portion of said receiver.

12. The method according to claim 7, comprising detecting said second DC offset in a "Q" (quadrature) signal component path in said RF front end portion of said receiver.

13. The method according to claim 7, comprising amplifying said calibration blocker signal in said RF front end portion of said receiver.

14. The method according to claim 7, wherein said calibration blocker signal is at least 6 MHz from a desired signal frequency in a channel of interest.

15. The method according to claim 7, comprising detecting said first DC offset and said second DC offset at a plurality of instances during the operation of said RF front end portion of said receiver.

16. The method according to claim 15, wherein said plurality of instances are determined based on a specified time interval or on a specified packet interval.

17. The method according to claim 15, comprising generating said first DC offset current and said second DC offset current for each of said plurality of instances.

18. The method according to claim 15, comprising storing a parameter that represents said generated first DC offset current and a parameter that represents said generated second DC offset current for each of said plurality of instances.

19. A system for signal processing, the system comprising:
one or more circuits in a radio frequency (RF) front end portion of a receiver, said one or more circuits enable:
reception of a calibration blocker signal via a component that is shared by a transmitter and said receiver, wherein:
said calibration blocker signal is coupled into said RF front end portion of said receiver from an RF front end portion of said transmitter; and
said RF front end portion of said receiver, said RF front end portion of said transmitter, and said shared component are integrated within a single device;
detection of a first DC offset and a second DC offset in said RF front end portion of said receiver, wherein said first DC offset and said second DC offset are produced by said received calibration blocker signal; and
generation of a first DC offset current to compensate for said detected first DC offset and a second DC offset current to compensate for said detected second DC offset.

20. The system according to claim 19, wherein said one or more circuits comprise at least one processor that enables operation of said RF front end portion of said receiver.

21. The system according to claim 19, wherein said one or more circuits enable storage of a parameter that represents said generated first DC offset current and a parameter that represents said generated second DC offset current.

22. The system according to claim 19, wherein said one or more circuits enable said parameter that represents said generated first DC offset current and said parameter that represents said generated second DC offset current to be transferred to and stored in a system memory.

23. The system according to claim 19, wherein said calibration blocker signal is at least 6 MHz from a desired signal frequency in a channel of interest.

24. The system according to claim 19, wherein said one or more circuits enable detection of said first DC offset in an "I" (in-phase) signal component path in said RF front end portion of said receiver.

25. The system according to claim 19, wherein said one or more circuits enable detection of said second DC offset in a "Q" (quadrature) signal component path in said RF front end portion of said receiver.

26. A system for signal processing, the system comprising:
one or more circuits in a radio frequency (RF) front end portion of a receiver, said one or more circuits enable:
detection of a first DC offset and a second DC offset in said RF front end portion of said receiver, wherein:
said first DC offset and said second DC offset are produced by a calibration blocker signal received from an RF front end portion of a transmitter; and
said RF front end portion of said receiver and said RF front end portion of said transmitter are integrated within a single device; and
generation of a first DC offset current to compensate for said detected first DC offset and a second DC offset current to compensate for said detected second DC offset.

27. The system according to claim 26, wherein one or more circuits in said transmitter comprise at least one processor that enables a transmit mode in said RF front end portion of said transmitter.

28. The system according to claim 26, wherein said RF front end portion of said transmitter comprises a power amplifier that enables amplification of said calibration blocker signal.

29. The system according to claim 26, wherein said one or more circuits enable storage of a parameter that represents said generated first DC offset current and a parameter that represents said generated second DC offset current.

30. The system according to claim 26, wherein said one or more circuits enable storage, in a system memory, of said parameter that represents said generated first DC offset current and said parameter that represents said generated second DC offset current.

31. The system according to claim 26, wherein said one or more circuits enable detection of said first DC offset in an "I" (in-phase) signal component path in said RF front end portion of said receiver.

32. The system according to claim 26, wherein said one or more circuits enable detection of said second DC offset in a "Q" (quadrature) signal component path in said RF front end portion of said receiver.

33. The system according to claim 26, wherein a low noise amplifier in said RF front end portion of said receiver enables amplification of said calibration blocker signal.

34. The system according to claim 26, wherein said calibration blocker signal is at least 6 MHz from a desired signal frequency in a channel of interest.

35. The system according to claim 26, wherein said one or more circuits enable detection of said first DC offset and said second DC offset in said RF front end portion of said receiver at a plurality of instances during the operation of said RF front end portion of said receiver.

36. The system according to claim 35, wherein said one or more circuits comprise at least one processor that enables determination of said plurality of instances based on a specified time interval or on a specified packet interval.

37. The system according to claim 35, wherein said one or more circuits enable generation of said first DC offset current and said second DC offset current for each of said plurality of instances.

* * * * *